United States Patent
Mina et al.

(10) Patent No.: US 7,490,304 B2
(45) Date of Patent: Feb. 10, 2009

(54) DETERMINING GEOMETRICAL CONFIGURATION OF INTERCONNECT STRUCTURE

(75) Inventors: Essam Mina, South Burlington, VT (US); William Piper, Hinesburg, VT (US); Wayne H. Woods, Jr., Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 221 days.

(21) Appl. No.: 11/426,053

(22) Filed: Jun. 23, 2006

(65) Prior Publication Data

US 2007/0298527 A1    Dec. 27, 2007

(51) Int. Cl.
    *G06F 17/50* (2006.01)
(52) U.S. Cl. .......... 716/4; 716/5; 716/6; 716/19
(58) Field of Classification Search ........... 716/19–21, 716/4–6; 703/13–22; 430/5, 30; 438/14–18; 382/141–152

See application file for complete search history.

(56) References Cited

U.S. PATENT DOCUMENTS

| | | | |
|---|---|---|---|
| 5,610,833 A * | 3/1997 | Chang et al. | 716/11 |
| 5,790,479 A * | 8/1998 | Conn | 368/118 |
| 6,219,631 B1 * | 4/2001 | Oh et al. | 703/14 |
| 6,887,791 B2 * | 5/2005 | Jung | 438/689 |
| 7,254,792 B1 * | 8/2007 | Rekhi et al. | 716/5 |
| 2003/0070148 A1 * | 4/2003 | Chang et al. | 716/5 |
| 2006/0161412 A1 * | 7/2006 | Angyal et al. | 703/14 |
| 2007/0118349 A1 * | 5/2007 | Jakatdar et al. | 703/13 |

OTHER PUBLICATIONS

"A Method of precise estimation of Physical Parameter in LSI Interconnect Structures", Toshiki Kanamoto, Tetsuya Watanabe, and Mitsutoshi, IEIC Trans—Fundamentals, vol. E88-A, N. 12, @Dec. 2005.*

"Interconnect Strategy in Deep-Submicron Dram Technology", by Jae-Kyung, Si-Hong Kim, Yong Yae Park, Se-Jun Kim, and Jin Yong Chun, @IEEE 2000.*

* cited by examiner

*Primary Examiner*—Paul Dinh
*Assistant Examiner*—Nha T Nguyen
(74) *Attorney, Agent, or Firm*—Richard M. Kotulak; Hoffman Warnick LLC

(57) ABSTRACT

Methods are disclosed for determining a geometrical configuration of an interconnect structure of a test structure without cross-sectioning or optical measurements. In one embodiment, the method includes obtaining simulation data correlating capacitance data, resistance data and geometrical configuration data for a plurality of interconnect structures having different geometrical configurations; measuring a capacitance value and a resistance value from the interconnect structure of the test structure; and determining the geometrical configuration of the interconnect structure by comparing the capacitance value and the resistance value to the simulation data.

4 Claims, 1 Drawing Sheet

DETERMINING GEOMETRICAL CONFIGURATION OF INTERCONNECT STRUCTURE

BACKGROUND OF THE INVENTION

1. Technical Field

The invention relates generally to semiconductor fabrication, and more particularly, to methods for determining a geometrical configuration of an interconnect structure of a test structure.

2. Background Art

It is difficult to obtain geometrical configurations or dimensions of typical high-performance digital interconnect structures. Currently, there is no way to determine the geometrical configuration of an interconnect structure of a test structure other than by cross-sectioning a wafer containing the test structure, which destroys the wafer, and performing some sort of measurement analysis, e.g., using a scanning electron microscope (SEM). This process is time consuming and is never comprehensive because it cannot be applied to all interconnect structures on a wafer.

SUMMARY OF THE INVENTION

Methods are disclosed for determining a geometrical configuration of an interconnect structure of a test structure without cross-sectioning or optical measurements. In one embodiment, the method includes obtaining simulation data correlating capacitance data, resistance data and geometrical configuration data for a plurality of interconnect structures having different geometrical configurations; measuring a capacitance value and a resistance value from the interconnect structure of the test structure; and determining the geometrical configuration of the interconnect structure by comparing the capacitance value and the resistance value to the simulation data.

A first aspect of the invention provides a method of determining a geometrical configuration of an interconnect structure of a test structure, the method comprising: obtaining simulation data correlating capacitance data, resistance data and geometrical configuration data for a plurality of interconnect structures having different geometrical configurations; measuring a capacitance value and a resistance value from the interconnect structure of the test structure; and determining the geometrical configuration of the interconnect structure by comparing the capacitance value and the resistance value to the simulation data.

A second aspect of the invention provides a method of determining a geometrical configuration of an interconnect structure of a test structure, the method comprising: obtaining simulation data correlating capacitance data, resistance data and geometrical configuration data for a plurality of interconnect structures having different geometrical configurations; measuring a capacitance value and a resistance value from the interconnect structure of the test structure by: obtaining delay information of the interconnect structure from at least one ring oscillator coupled to the interconnect structure, and determining the capacitance value and the resistance value based on the delay information; and determining the geometrical configuration of the interconnect structure by comparing the capacitance value and the resistance value to the simulation data.

A third aspect of the invention provides a method of determining a geometrical configuration of an interconnect structure of a test structure, the method comprising: a) obtaining simulation data correlating capacitance data, resistance data and geometrical configuration data for a plurality of interconnect structures having different geometrical configurations by: determining a capacitance value and a resistance value for each of the plurality of geometrical configurations of an interconnect structure in an integrated circuit (IC) design using a field solver and simulation analytical equations; interpolating the capacitance value and the resistance value of the different geometrical configurations to increase a number of data points in the simulation data; saving the simulation data in a database, and allowing access to the database; b) measuring a capacitance value and a resistance value from the interconnect structure of the test structure by: obtaining delay information of the interconnect structure from at least one ring oscillator coupled to the interconnect structure, and determining the capacitance value and the resistance value based on the delay information, wherein an inverter of the at least one ring oscillator is coupled to each side of the interconnect structure; and c) determining the geometrical configuration of the interconnect structure by comparing the capacitance value and the resistance value to the simulation data.

A fourth aspect of the invention provides a system for determining a geometrical configuration of an interconnect structure of a test structure.

A fifth aspect of the invention provides a program product for determining a geometrical configuration of an interconnect structure of a test structure.

A sixth aspect of the invention provides a computer-readable medium that includes computer program code to enable a computer infrastructure to determine a geometrical configuration of an interconnect structure of a test structure, the computer-readable medium comprising computer program code for performing the method steps of the invention.

An seventh aspect of the invention provides a business method for determining a geometrical configuration of an interconnect structure of a test structure, the business method comprising managing a computer infrastructure that performs each of the steps of the invention; and receiving payment based on the managing step.

An eighth aspect of the invention provides a method of generating a system for determining a geometrical configuration of an interconnect structure of a test structure, the method comprising: obtaining a computer infrastructure; and deploying means for performing each of the steps of the invention to the computer infrastructure.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 1:
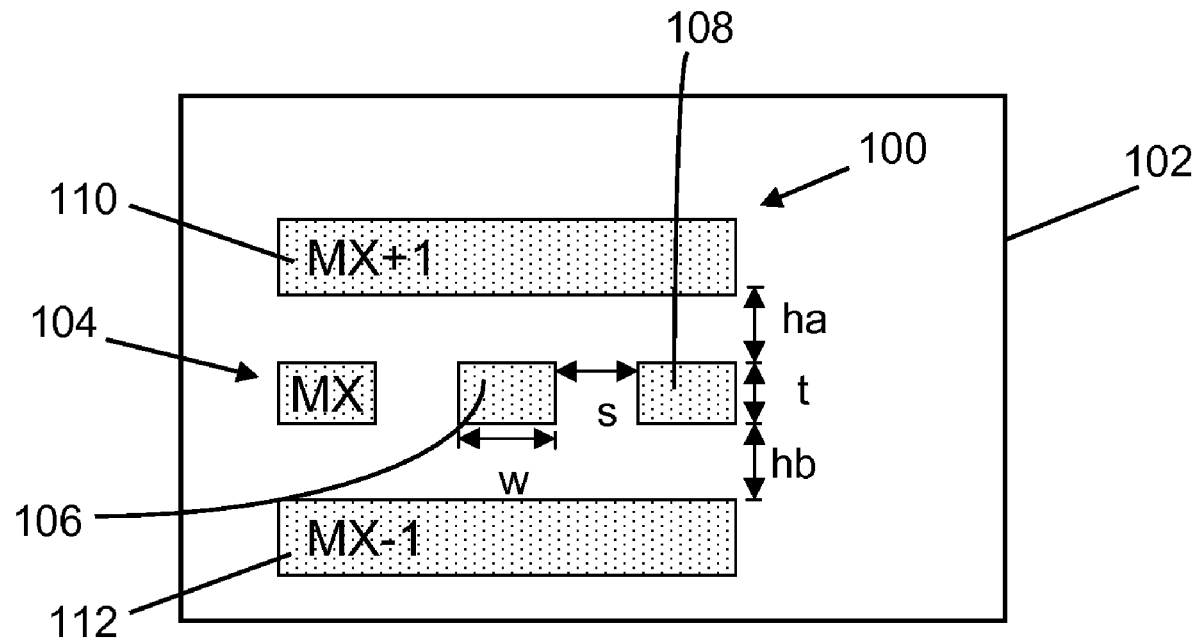
FIG. 1 shows an illustrative interconnect structure according to one embodiment of the invention.

Turning to the drawings, FIG. 1 shows one embodiment of interconnect structures 100 within a test structure 102. It is understood that interconnect structures 100 are only a few of an innumerable variety of interconnect structures to which the teachings of the invention may be applied. In this example, interconnect structures 100 include a metal layer MX, a metal layer below MX−1, and a metal layer above MX+1. Metal layer MX has a number of interconnect structures 104, e.g., vias, wires, etc., that are separated from one another, and metal layers MX−1 and MX+1 are each shown with one interconnect structure 110, 112. Each interconnect structure has a particular geometrical configuration. As used herein, "geometrical configuration" may indicate one or more of a variety of geometrical dimensions such as width, thickness, space to neighboring interconnect structures, or any other useful geometric dimension. For example, interconnect structure 106 in interconnect structures 100 has a space (s) between itself and a neighboring interconnect structure 108, a width (w) and a thickness (t), a height above (ha) to another interconnect structure 110 and a height below (hb) to another interconnect structure 112. Different geometrical configurations are indicated by variants of one or more of the above listed dimensions. The following description refers to interconnect structure 106, however, it is understood that the teachings can be applied to any interconnect structure 106, 108, 110, 112, etc.

A first step of one embodiment of a method of determining a geometrical configuration of interconnect structure 106 includes obtaining simulation data correlating capacitance data, resistance data and geometrical configuration data for a plurality of interconnect structures, i.e., different variations of an interconnect structure 106, having different geometrical configurations. This determination may include determining a capacitance value (C) and a resistance value (R) for each of a plurality of geometrical configurations of interconnect structure 106, in test structure 102 using a field solver and simulation analytical equations. That is, a conventional field solver (e.g., Raphael, QuickCap, etc.) and simulation analytical equations such as those available as part of a design manual can be used to simulate interconnect structure 106 within test structure 102 to estimate a related capacitance value and resistance value for the particular interconnect structure and the particular geometric configuration thereof. In one embodiment, this determination may include varying the above-described dimensions, i.e., w, t, s, ha, hb, over a wide range such as between −3 standard deviations (−3σ) to +3σ. For example, each may be varied for 5 data points at 5 points: −3σ(nominal value), −1.5σ(nominal value), nominal value, +1.5σ(nominal value) and +3σ(nominal value). The five data points for each of the five dimensions above results in 625 geometrical configurations, each with its own corresponding capacitance value and resistance value. Each capacitance value and each resistance value may also include a number of values indicative of a direction from interconnect structure 106. For example, a capacitance value may include total capacitance ($C_{tot}$), capacitance up ($C_{up}$), capacitance down ($C_{down}$), capacitance left ($C_{left}$), capacitance right ($C_{right}$).

Next, an interpolation of the capacitance value and the resistance value and the different geometrical configurations may be performed to increase a number of data points in the simulation data, if desired. In this case, the number of data points can be increased beyond 625 to as many as desired. The simulation data generated may be saved and access thereto allowed in any now known or later developed fashion, e.g., data may be saved in a database that is made accessible via a computer infrastructure.

Figure 2:
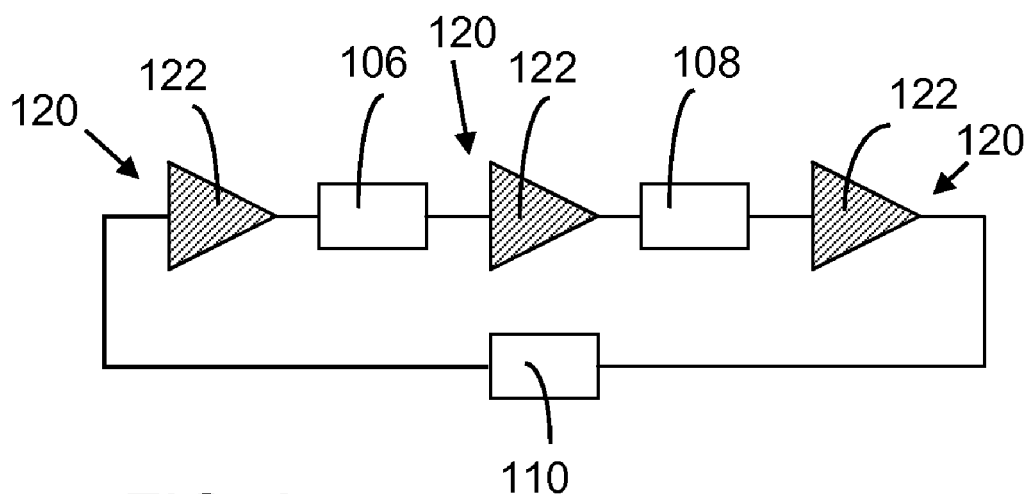
FIG. 2 shows one embodiment of ring oscillators used to determine a geometrical configuration of an interconnect structure.

Next, in operation, a capacitance value and a resistance value are measured from interconnect structure 106 of actual interconnect structures 100. The measurement can be achieved in a number of ways. In one embodiment, as shown in FIG. 2, the measurement can include obtaining delay information of interconnect structure 106 from at least one ring oscillator 120 coupled to interconnect structure 106. As shown in FIG. 2, each ring oscillator 120 may include an inverter 122. An inverter 122 is coupled to each side of interconnect structure 106, 108, 110, 112, etc. The delay information measured can then be used to determine the capacitance value and the resistance value based on the delay information. For example, the capacitance value and the resistance value can be determined based on the product of the capacitance value and the resistance value, or, using multiple ring oscillators, with variations of test structure 102, to determine the component resistance and capacitance delay products (i.e., Cup*R, Cdown*R, Cleft*R, Cright*R). In an alternative embodiment, the measurement may include obtaining the capacitance value and the resistance value directly using passive-only back-end-of-line hardware such as a direct current (DC) measurement system, to directly measure the capacitance value, e.g., total capacitance ($C_{tot}$), capacitance up ($C_{up}$), capacitance down ($C_{down}$), capacitance left ($C_{left}$), capacitance right ($C_{right}$), and the resistance value.

The geometrical configuration of interconnect structure 106 can then be determined by comparing the capacitance value and the resistance value to the simulation data, e.g., using conventional database searching software. That is, based on the determined capacitance value and resistance value, a best fit geometrical configuration can be ascertained from the simulation data. As a result, very accurate geometrical configurations of interconnect structure 106 can be determined without cross-sectioning a wafer. In particular, the data available would be similar to that obtained by cross-sectioning a wafer and performing a scanning electron microscope (SEM) analysis of every test structure measured. If ring oscillators 120 are used, they can be positioned within with kerf test structures so that the interconnect structure geometric configuration can be characterized for every wafer through a fabrication line.

It is understood that the order of the above-described methods are only illustrative. To this extent, one or more steps can be performed in parallel, in a different order, at a remote time, etc. Further, one or more of the steps may not be performed in various embodiments of the invention.

While shown and described herein as a method, it is understood that the invention further provides various alternative embodiments. For example, in one embodiment, the invention provides a system and/or a computer-readable medium that includes computer program code to enable a computer infrastructure to determine the geometrical configuration of an interconnect structure of a test structure. To this extent, the computer-readable medium includes program code that implements each of the various process steps of the invention. It is understood that the term "computer-readable medium" comprises one or more of any type of physical embodiment of the program code. In particular, the computer-readable medium can comprise program code embodied on one or more portable storage articles of manufacture (e.g., a compact disc, a magnetic disk, a tape, etc.), on one or more data storage portions of a computing device, such as memory and/or storage system (e.g., a fixed disk, a read-only memory, a random access memory, a cache memory, etc.), and/or as a data signal traveling over a network (e.g., during a wired/wireless electronic distribution of the program code).

In another embodiment, the invention provides a business method that performs the process steps of the invention on a subscription, advertising, and/or fee basis. That is, a service provider, such as an Application Service Provider, could offer to determine a geometrical configuration of an interconnect structure of a test structure as described above. In this case, the service provider can manage (e.g., create, maintain, support, etc.) a computer infrastructure that performs the process steps of the invention for one or more customers. In return, the service provider can receive payment from the customer(s) under a subscription and/or fee agreement and/or the service provider can receive payment from the sale of advertising space to one or more third parties.

In still another embodiment, the invention provides a method of generating a system for determining a geometrical configuration of an interconnect structure of a test structure. In this case, a computer infrastructure can be obtained (e.g., created, maintained, having made available to, etc.) and one or more systems for performing the process steps of the invention can be obtained (e.g., created, purchased, used, modified, etc.) and deployed to the computer infrastructure. To this extent, the deployment of each system can comprise one or more of (1) installing program code on a computing device from a computer-readable medium; (2) adding one or more computing devices to the computer infrastructure; and (3) incorporating and/or modifying one or more existing systems of the computer infrastructure, to enable the computer infrastructure to perform the process steps of the invention.

As used herein, it is understood that the terms "program code" and "computer program code" are synonymous and mean any expression, in any language, code or notation, of a set of instructions intended to cause a computing device having an information processing capability to perform a particular function either directly or after any combination of the following: (a) conversion to another language, code or notation; (b) reproduction in a different material form; and/or (c) decompression. To this extent, program code can be embodied as one or more types of program products, such as an application/software program, component software/a library of functions, an operating system, a basic I/O system/driver for a particular computing and/or I/O device, and the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method of determining a geometrical configuration of an interconnect structure of a test structure, the method comprising:
   Obtaining simulation data correlating capacitance data, resistance data and geometrical configuration data for a plurality of interconnect structures having different geometrical configurations by:
      determining a capacitance value and a resistance value for each of the plurality of geometrical configurations of an interconnect structure in an integrated circuit (IC) design using a field solver and simulation analytical equations,
   increasing a number of data points in the simulation data by interpolating the capacitance value and the resistance value of the different geometrical configurations,
   saving the simulation data in a database, and
   allowing access to the database;
   Measuring a capacitance value and a resistance value from the interconnect structure of the test structure by:
      obtaining delay information of the interconnect structure from at least one ring oscillator coupled to the interconnect structure, and
      determining the capacitance value and the resistance value based on the delay information; and
   Determining the geometrical configuration of the interconnect structure by comparing the capacitance value and the resistance value to capacitance data and resistance data of the simulation data for the correlated geometrical configuration data.

2. The method of claim 1, wherein an inverter of the at least one ring oscillator is coupled to each side of the interconnect structure.

3. The method of claim 1, wherein the measuring includes obtaining the capacitance value and the resistance value directly using passive-only back-end-of-line hardware.

4. The method of claim 1, wherein the different geometrical configurations include variants of at least one of: a space between interconnect structures of the test structure, a width of an interconnect structure of the test structure, a thickness of an interconnect structure of the test structure, a height above an interconnect structure of the test structure and a height below an interconnect structure of the test structure.

* * * * *